(12) United States Patent
Ma

(10) Patent No.: US 6,764,876 B2
(45) Date of Patent: Jul. 20, 2004

(54) STRESS SHIELD FOR MICROELECTRONIC DICE

(75) Inventor: Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/349,891

(22) Filed: Jan. 22, 2003

(65) Prior Publication Data

US 2003/0107110 A1 Jun. 12, 2003

Related U.S. Application Data

(62) Division of application No. 09/522,314, filed on Mar. 9, 2000, now Pat. No. 6,570,245.

(51) Int. Cl.[7] .............................................. H01L 23/30
(52) U.S. Cl. ........................ 438/106; 438/121; 438/123
(58) Field of Search ................................ 438/106, 121, 438/123; 257/669, 676, 672, 787

(56) References Cited

U.S. PATENT DOCUMENTS

| 5,173,764 A | 12/1992 | Higgins, III |
| 6,147,141 A | 11/2000 | Iyer et al. |
| 6,214,716 B1 | 4/2001 | Akram |
| 6,300,686 B1 | 10/2001 | Hirano et al. |

FOREIGN PATENT DOCUMENTS

EP      0 577 966 A1      1/1994

*Primary Examiner*—Minhloan Tran
*Assistant Examiner*—Thomas L Dickey
(74) *Attorney, Agent, or Firm*—Blakely, Sokoloff, Taylor & Zafman LLP

(57) ABSTRACT

A stress shield made of a material having a CTE similar to that of the material used in the fabrication of a microelectronic die, including but not limited silicon, molybdenum, and aluminum nitride, which abuts at least one corner and/or edge of the microelectronic die. When the stress shield is positioned to abut the microelectronic die corners and/or edges, the mechanical stresses on the microelectronic die are greatly reduced or substantially eliminated.

22 Claims, 16 Drawing Sheets

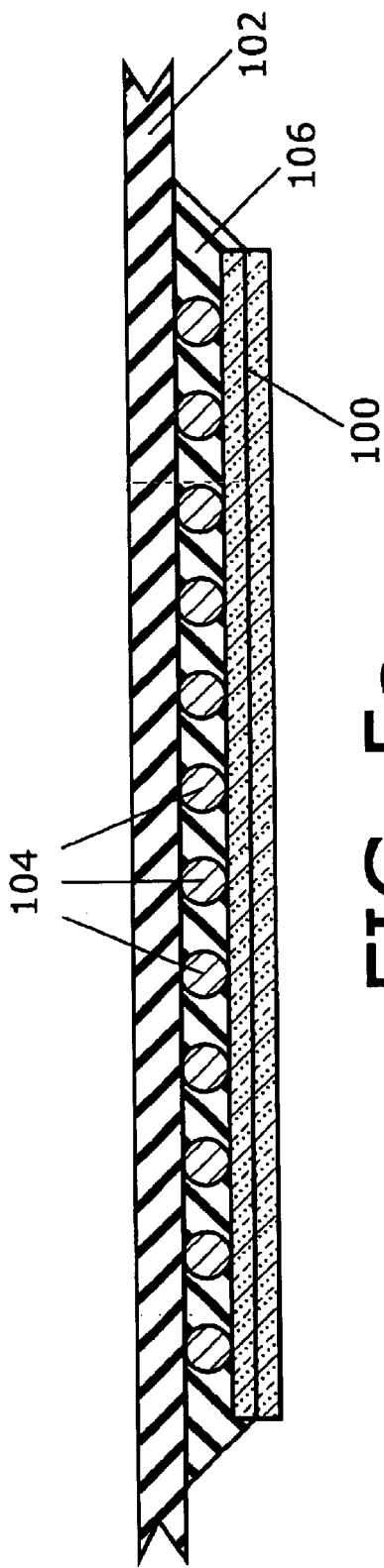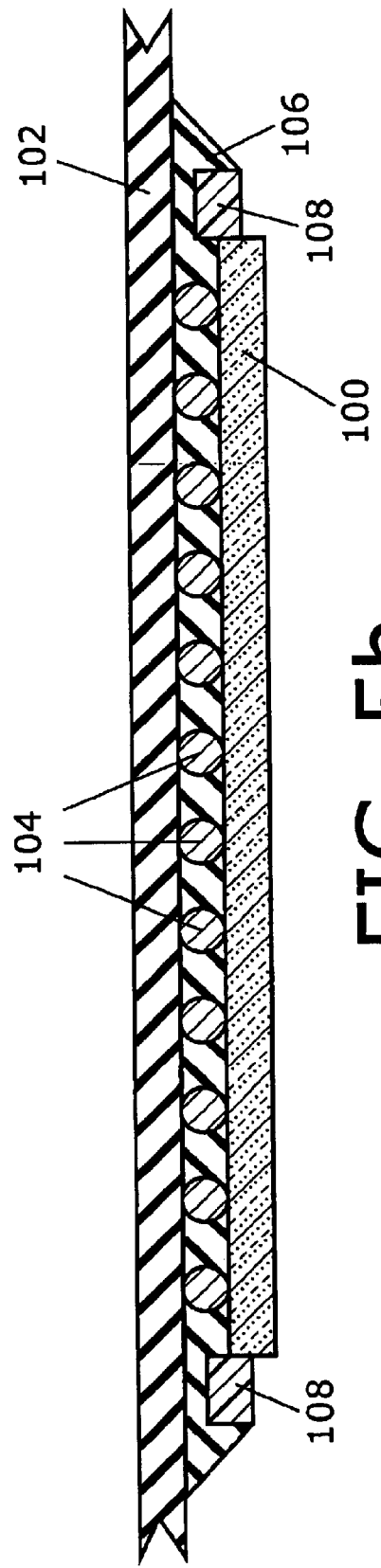

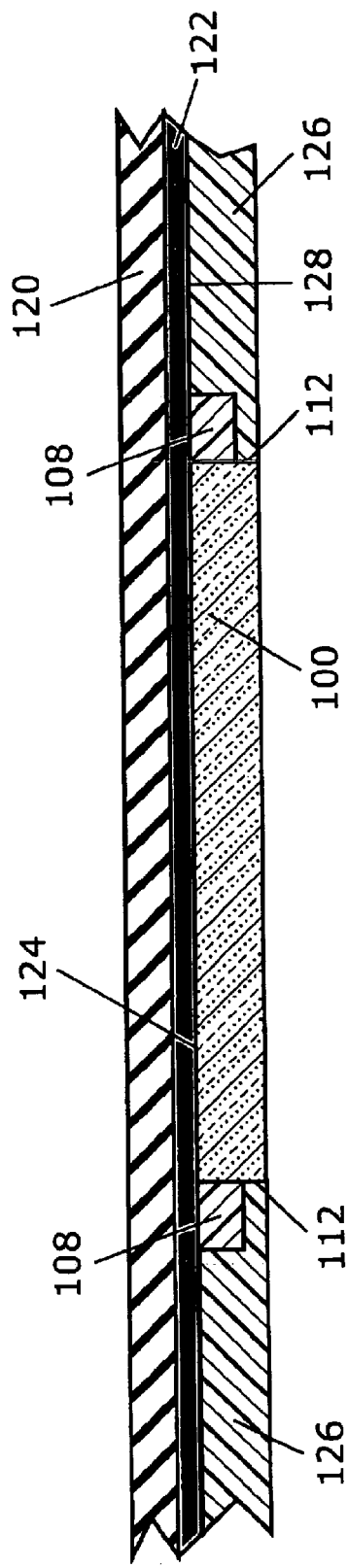
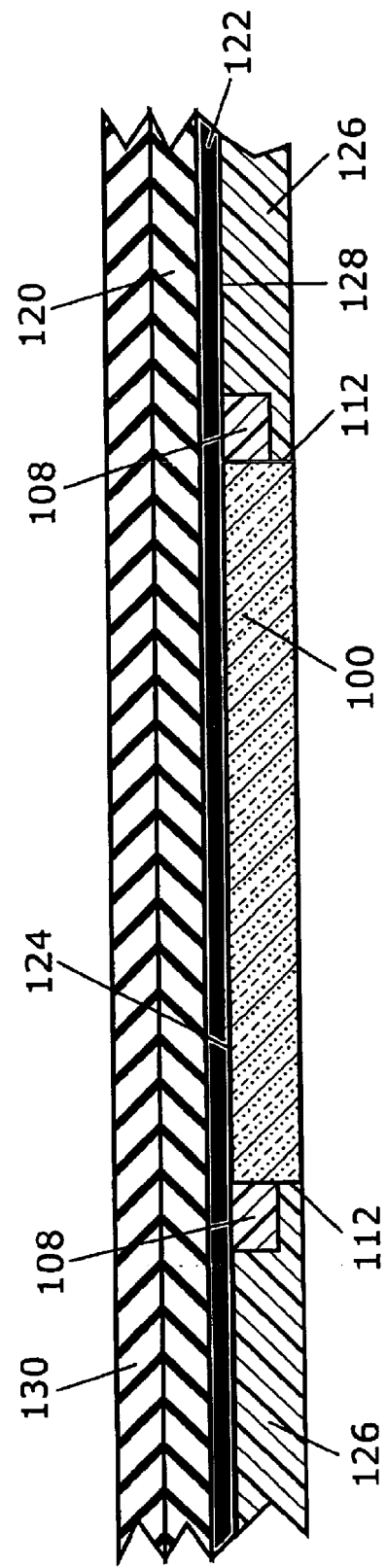

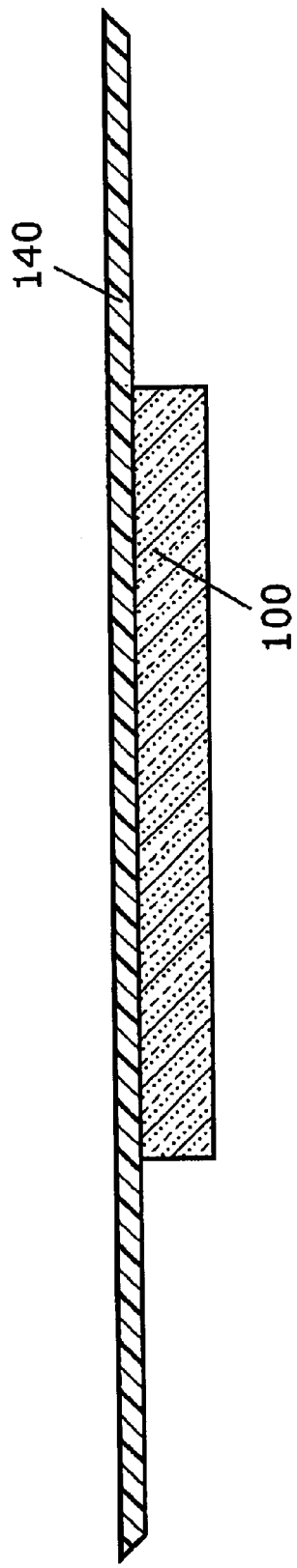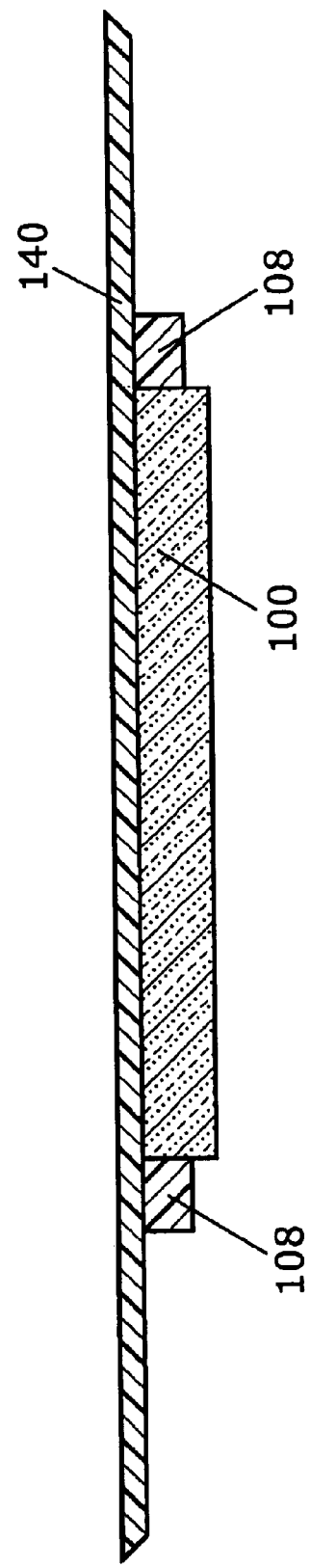

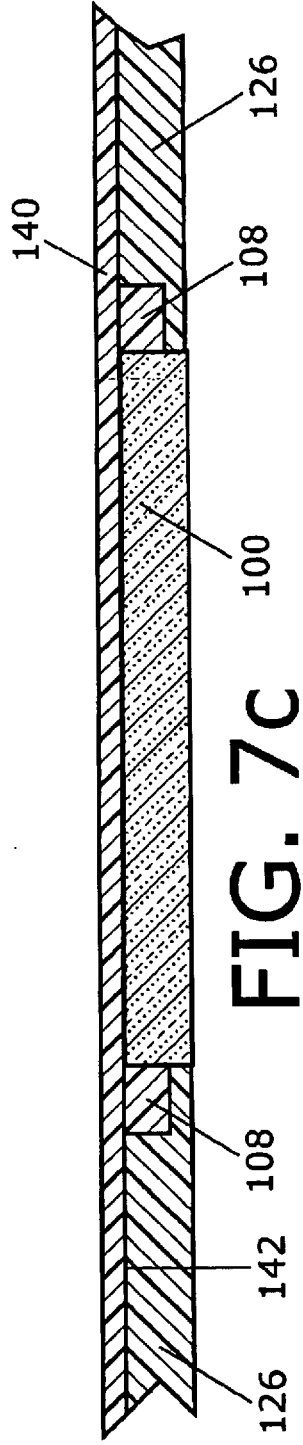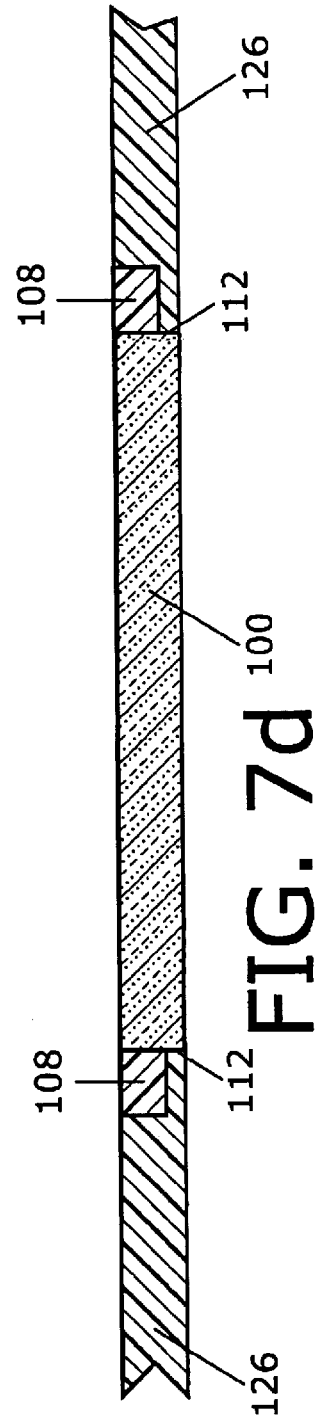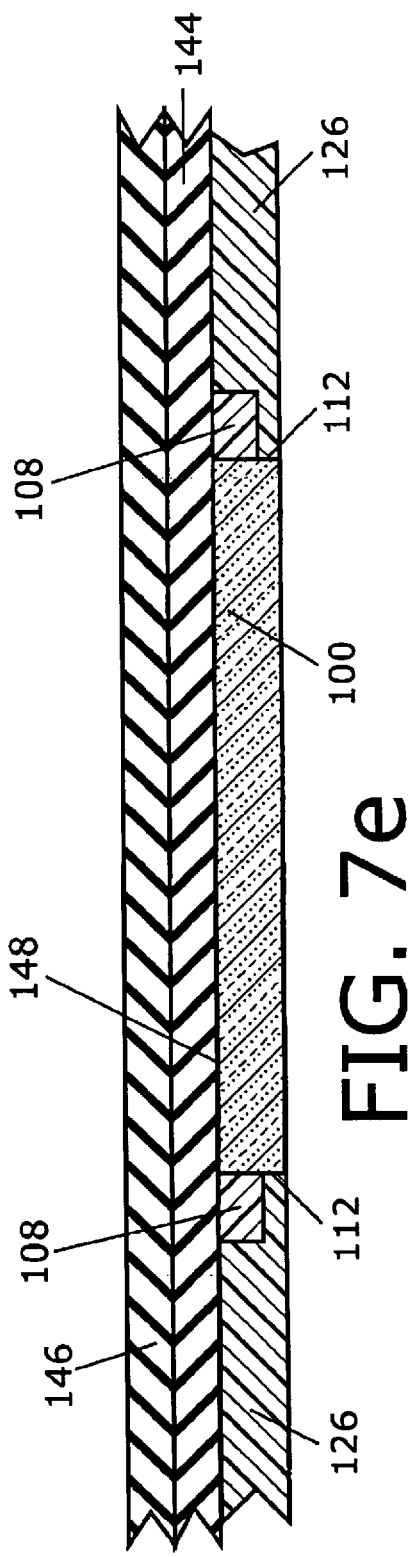

STRESS SHIELD FOR MICROELECTRONIC DICE

This U.S. Patent application is a divisional of U.S. patent application Ser. No. 09/522,314 filed Mar. 9, 2000 now U.S. Pat. No. 6,570,245.

BACKGROUND OF THE INVENTION

1. Field of the Invention

The present invention relates to apparatus and methods for fabricating microelectronic devices. In particular, the present invention relates to using a stress shield in the fabrication of microelectronic devices to reduce stress at corners and/or edges of microelectronic dice within the microelectronic devices.

2. State of the Art

As the size of electronic devices employing microelectronic dice continues to shrink and as the cost of such devices continues to fall, device manufacturers seek methods to incorporate microelectronic dice into their devices as efficiently as possible. The microelectronic dice should not require a large amount of space to mount, but must be securely and reliably affixed to their carrier substrates. The mounting method employed also should be as simple as possible, minimizing the time and equipment needed to mount the microelectronic dice to the substrates.

One mounting technology is called flip chip or C4 ("Controlled Collapse Chip Connection") attachment, which is an inverted microelectronic die mounted to a substrate with a bumping process. As shown in FIG. 8a, a flip chip 200 is a microelectronic die that has a pattern or array of terminations or bond pads 202, generally metal or metal alloy pads, spaced on an active surface 204 of the flip chip 200. An array of minute solder balls 206, generally lead/tin solder, is disposed on the flip chip bond pads 202, as shown in FIG. 8b.

The flip chip 200 is then positioned (i.e., flipped) such that the solder balls 206 are aligned with an array of bond pads 216 on an active surface 214 of a carrier substrate 212, as shown in FIG. 8c. The carrier substrate bond pads 216 are essentially in mirror-image placement to the flip chip bond pads 202. It is, of course, understood that the solder balls 206 could be formed on the carrier substrate bond pads 216, rather than the flip chip bond pads 202. The solder balls 206 are then heated thereby reflowing them, such that when cooled the solder balls 206 solidify to form conductive pillars between the flip chip bond pads 202 and the carrier substrate bond pads 216. An underflow material 218 is disposed between the flip chip 200 and the carrier substrate 212 to secure the flip chip 200 and to prevent possible contamination. This attachment technique is also used in C4 OLGA ("Organic Land Grid Array") and FCPGA ("Flip Chip Pin Grid Array") packages, as known in the art.

Another technology is called Chip-on-Flex ("COF") packaging, which is shown in FIGS. 9a–9d. A flex component 232 (i.e., the carrier substrate) is attached with an adhesive layer 230 to an active surface 234 of microelectronic die 236, as shown in FIG. 9a. The microelectronic die active surface 234 includes at least one contact 238. The microelectronic die 236 is then encapsulated with an encapsulating material 242, such as plastics, resins, and the like, as shown in FIG. 9b, that covers a back surface 244 and side(s) 246 of the microelectronic die 236, and abuts a bottom surface 248 of the adhesive layer 230 (the portion not covered by the microelectronic die 236).

As shown in FIG. 9c, a plurality of conductive traces 254 are formed on an upper surface 256 of the flex component 232 and extend into vias 258 (formed through the flex component 232 and adhesive layer 230) to contact the contacts 238. The vias 258 may be formed by any known technique, but are general formed by laser ablation. The conductive traces 254 may also be formed by any known technique, such as photolithography.

As shown in FIG. 9d, a plurality of additional flex component layers are stacked by attaching one atop another, represented by elements 232' and 232", with additional conductive traces formed thereon, represented by elements 254' and 254". A layer of solder resist 262 is then applied over the uppermost flex component layer and conductive traces, represented by elements 232" and 254", respectively. A plurality of vias 264 are formed through the solder resist layer 262 to expose a portion of the uppermost conductive trace, represented as element 254" and external contacts are formed on the conductive traces 254" (shown as solder balls 266). The solder balls 266 may be attached to a substrate in a manner similar to flip chip attachment, as shown in FIGS. 8a–8c.

Although the discussed techniques are widely used in the industry, the devices made from such techniques suffer from stress problems. The stresses are caused by a mismatch in the coefficients of thermal expansion ("CTE") between the microelectronic dice and the packaging material (substrates, flex components, dielectric layers, etc.). These CTE induced stresses can cause mechanical damage including, but not limited to thin-film cracking and/or delamination, detachment of solder balls from the microelectronic die or the substrate, and cracking of the microelectronic dice. This problem can be lessened by excluding sensitive circuitry from the corners and/or edges of the microelectronic die. However, this approach is prohibitively expensive.

Therefore, it would be advantageous to develop an apparatus and technique to effectively achieve attachment of a microelectronic die to a supporting substrate, while eliminating or substantially reducing the potential for mechanical damage due to CTE mismatch.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 5a–5b are side cross-sectional views of a method of incorporating the stress shield into a flip chip package, according to the present invention;

FIGS. 6a–6d are side cross-sectional views of a method of incorporating the stress shield into a COF package, according to the present invention;

FIGS. 7a–7e are side cross-sectional-views of a method of incorporating the stress shield into a build-up layer package, according to the present invention;

DETAILED DESCRIPTION OF THE ILLUSTRATED EMBODIMENT

Although FIGS. 1–3, 4a–4c, 5a–5b, 6a–6d, and 7a–7e illustrate various views of the present invention, these figures are not meant to portray microelectronic devices in precise detail. Rather, these figures illustrate microelectronic devices in a manner to more clearly convey the concepts of the present invention. Additionally, elements common between the figures retain that same numeric designation.

The present invention utilizes a "stress shield" made of a material having a CTE similar to that of the material used in the fabrication of a microelectronic die, including but not limited silicon, molybdenum, and aluminum nitride, abutting at least one corner and/or edge of the microelectronic die. When a stress shield is positioned to abut the microelectronic die corners and/or edges, the mechanical stresses on the microelectronic die are greatly reduced or substantially eliminated. A "corner" is defined to include the convergence of two edges of the microelectronic die.

Figure 1:
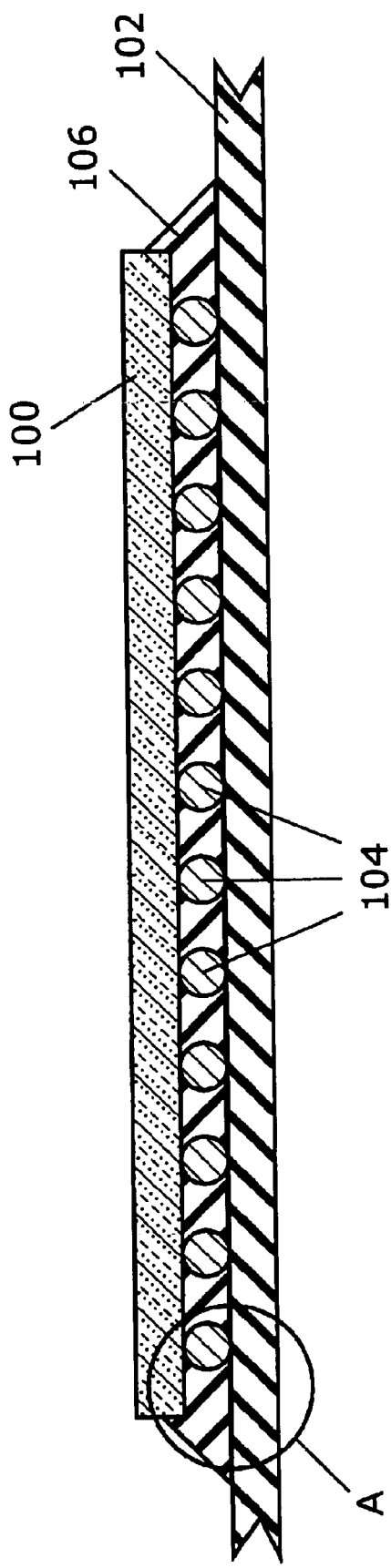
FIG. 1 is a side cross-sectional view of a flip chip.
Figure 8A:
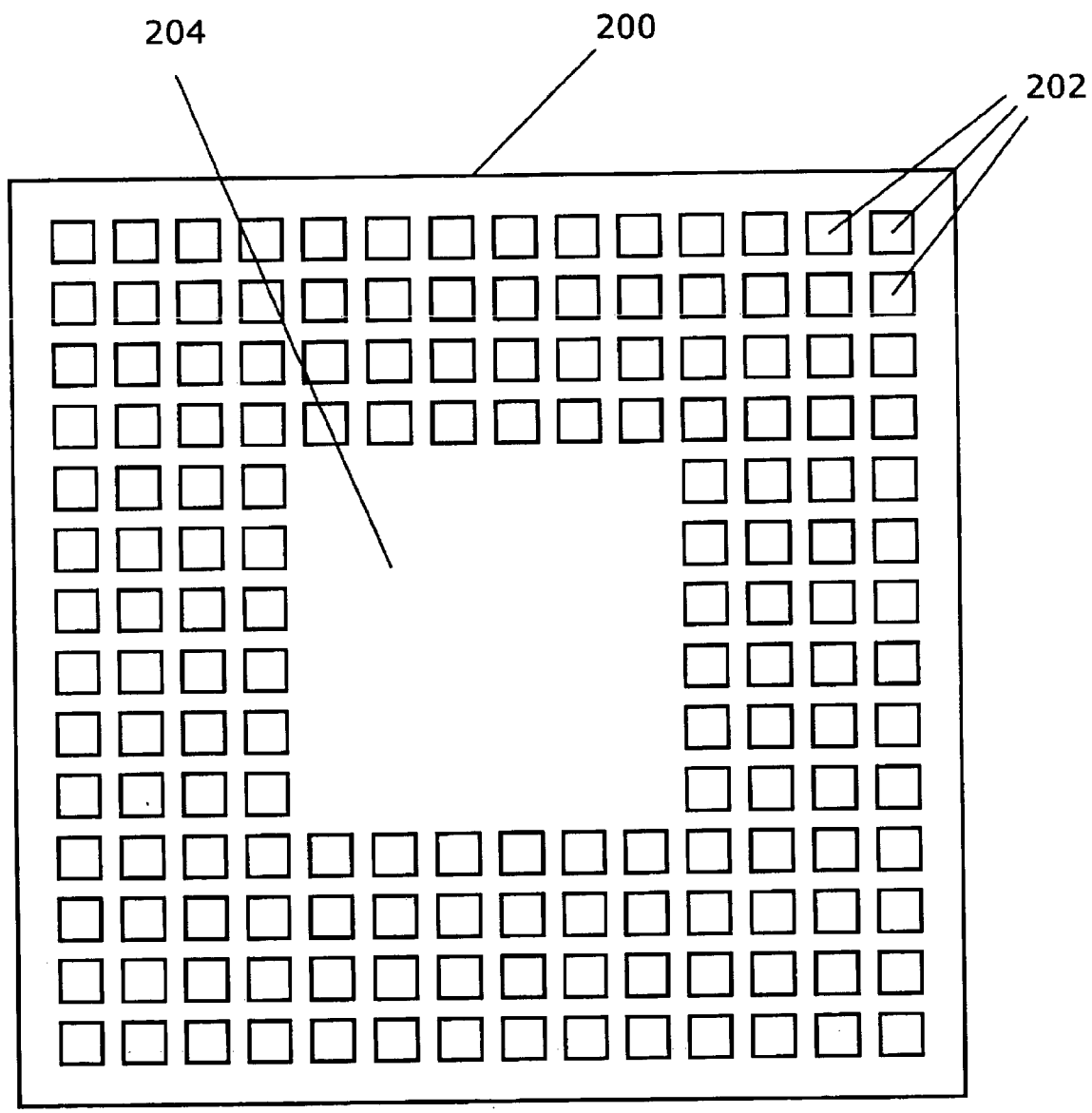
FIGS. 8a–8c are various views of a flip chip and a flip chip package, as known in the art.
Figure 8B:
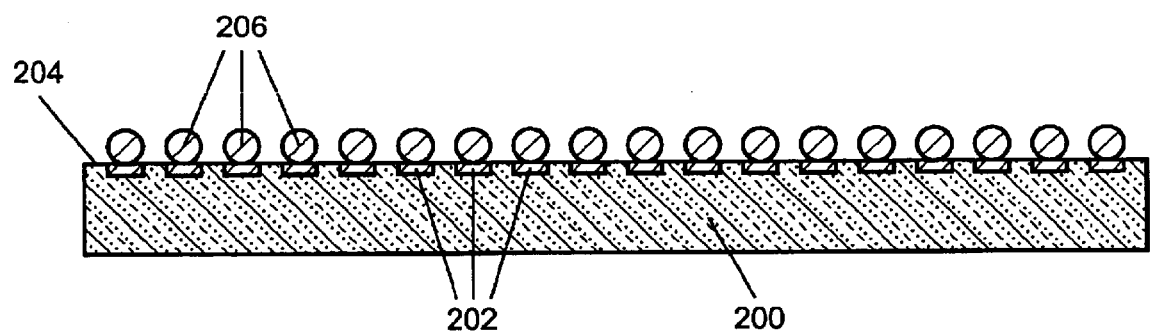
Figure 8C:
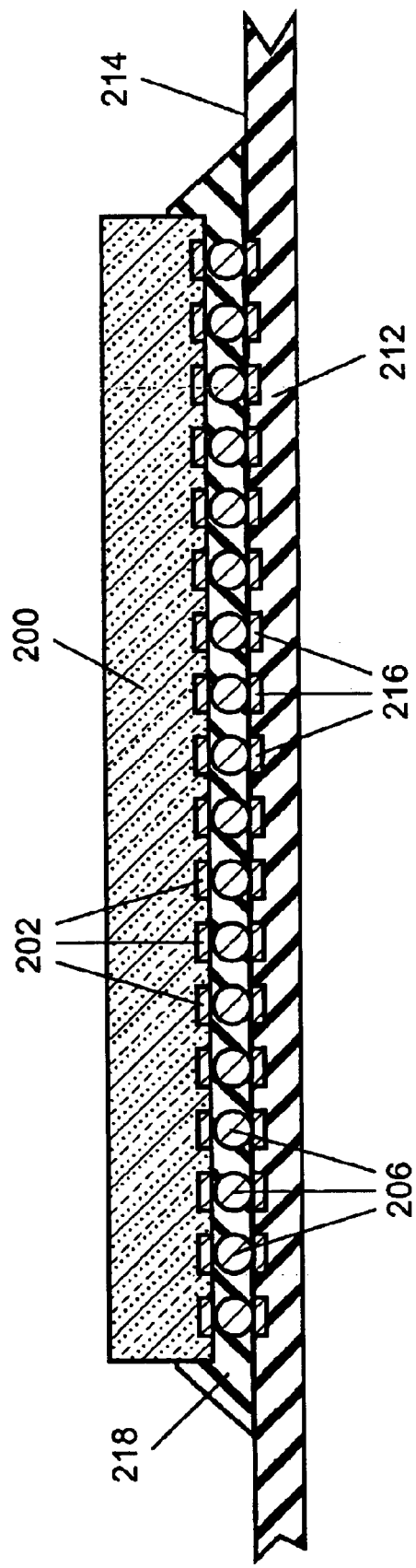
Figure 9A:
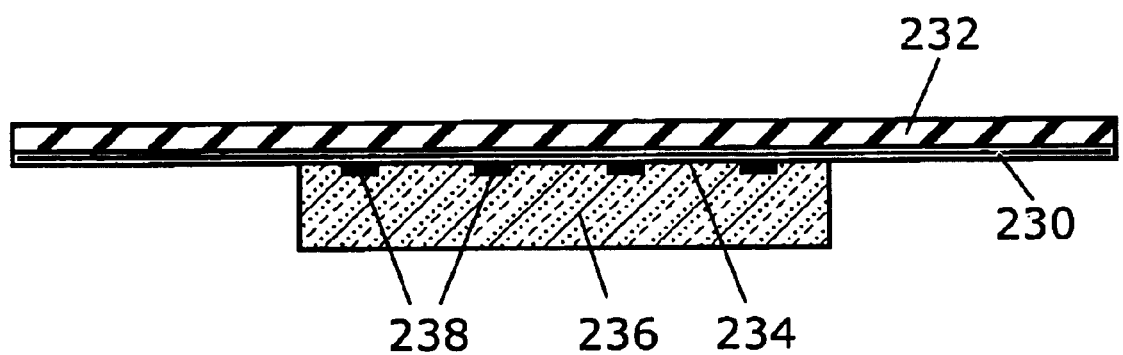
FIGS. 9a–9d are a side cross-sectional views of a method of forming a COF package, as known in the art.
Figure 9B:
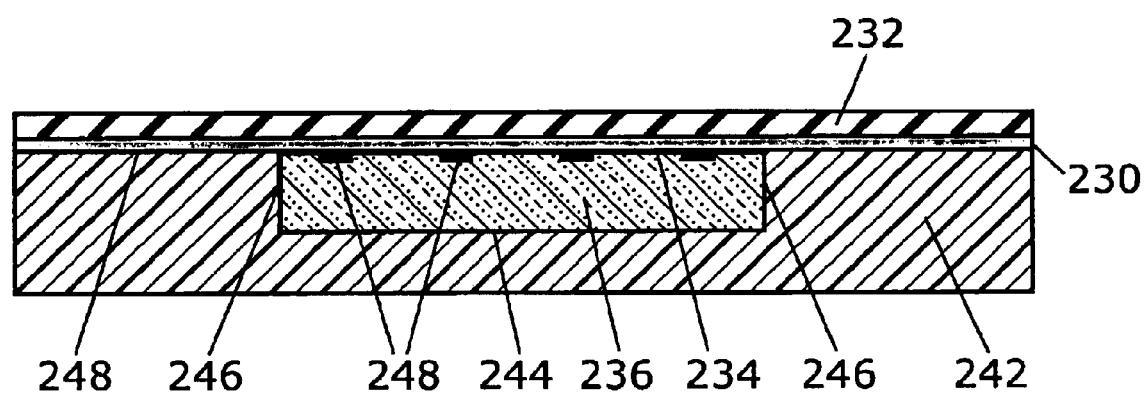
Figure 9C:
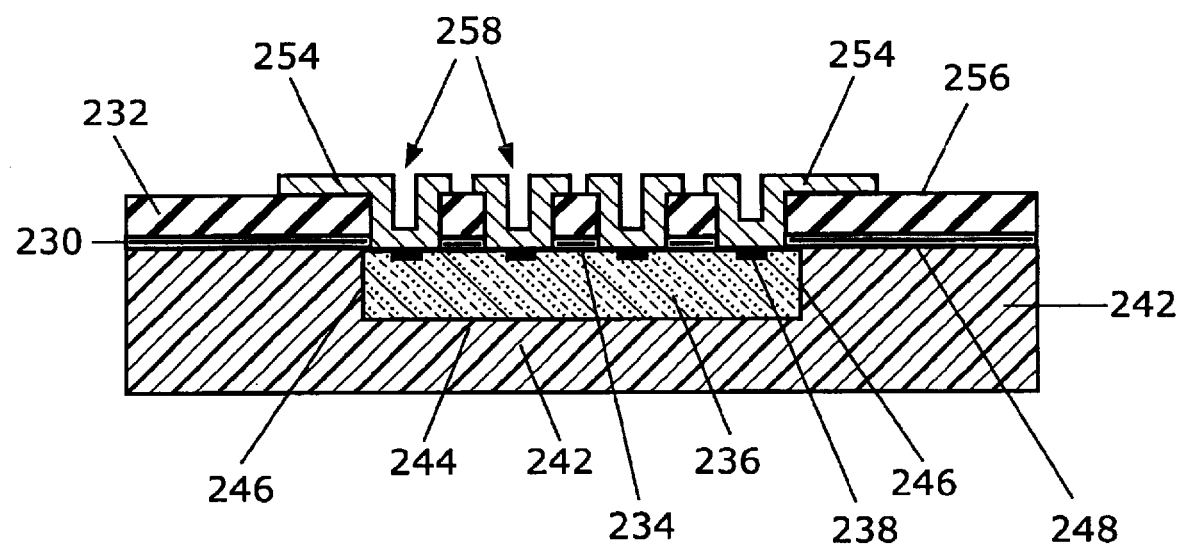
Figure 9D:
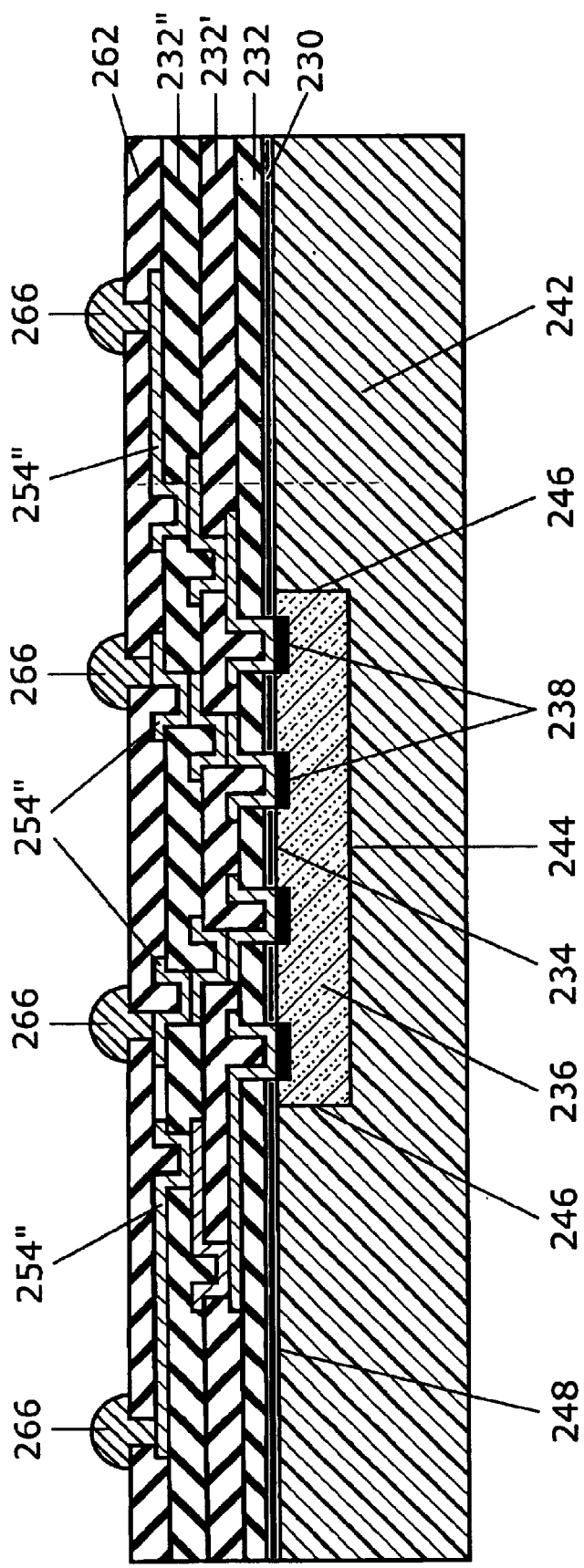

FIG. 1 illustrates an embodiment of the present invention for, wherein a microelectronic die 100 is attached to a carrier substrate 102 through a plurality of the solder balls 104 in a flip chip attachment arrangement, as previously discussed for FIGS. 8a–8c. An underfill material 106 is disposed between the microelectronic die 100 and the carrier substrate 102, and generally a portion of the underfill material 106 extends beyond the microelectronic die 100. Circle A shows the approximate area where significant CTE stress generally occurs.

Figure 2:
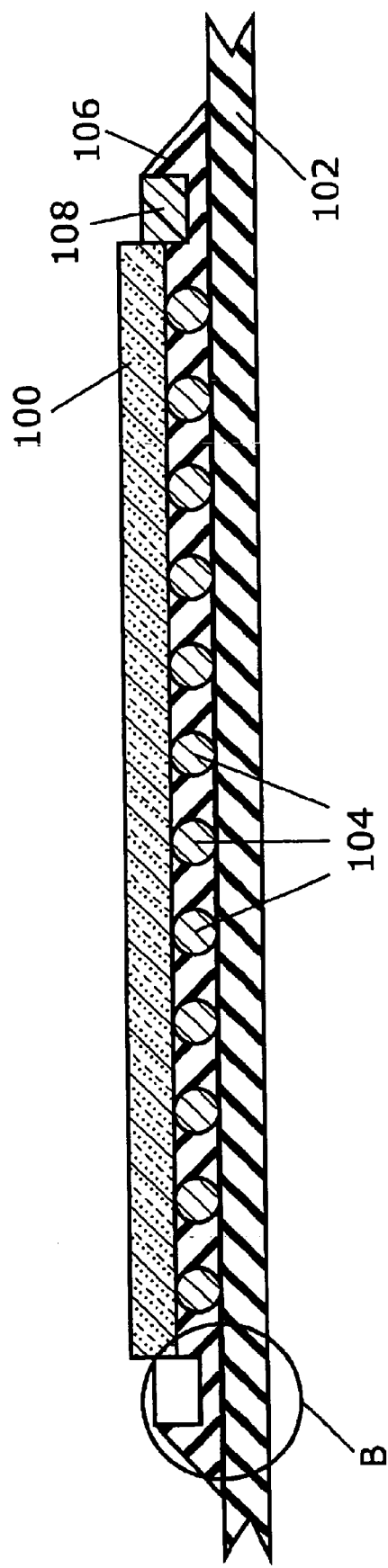
FIG. 2 is a side cross-sectional view of the flip chip of FIG. 1 having a stress shield abutting the edges of the flip chip, according to the present invention.

As shown in FIG. 2, before the underfill material 106 has been cured or otherwise hardened, a stress shield 108 is placed against at least one side 112 of the microelectronic die 100, such that the stress shield 108 contacts a portion of the underfill material 106. The CTE stress area A of FIG. 1 is effectively shifted to the stress shield 108 shown as CTE stress area B in FIG. 2. This results in a substantial reduction or an elimination of the problems CTE stress on the microelectronic die 100. The stress shield 108 is preferably as thick or thinner that the microelectronic die 100 such that it will no interfere with components which may be subsequently attached to the microelectronic die 100 (i.e., a heat sink or the like). Further, the stress shield 108 should be wide enough to shift the CTE stress area away from the microelectronic die 100.

Figure 3:
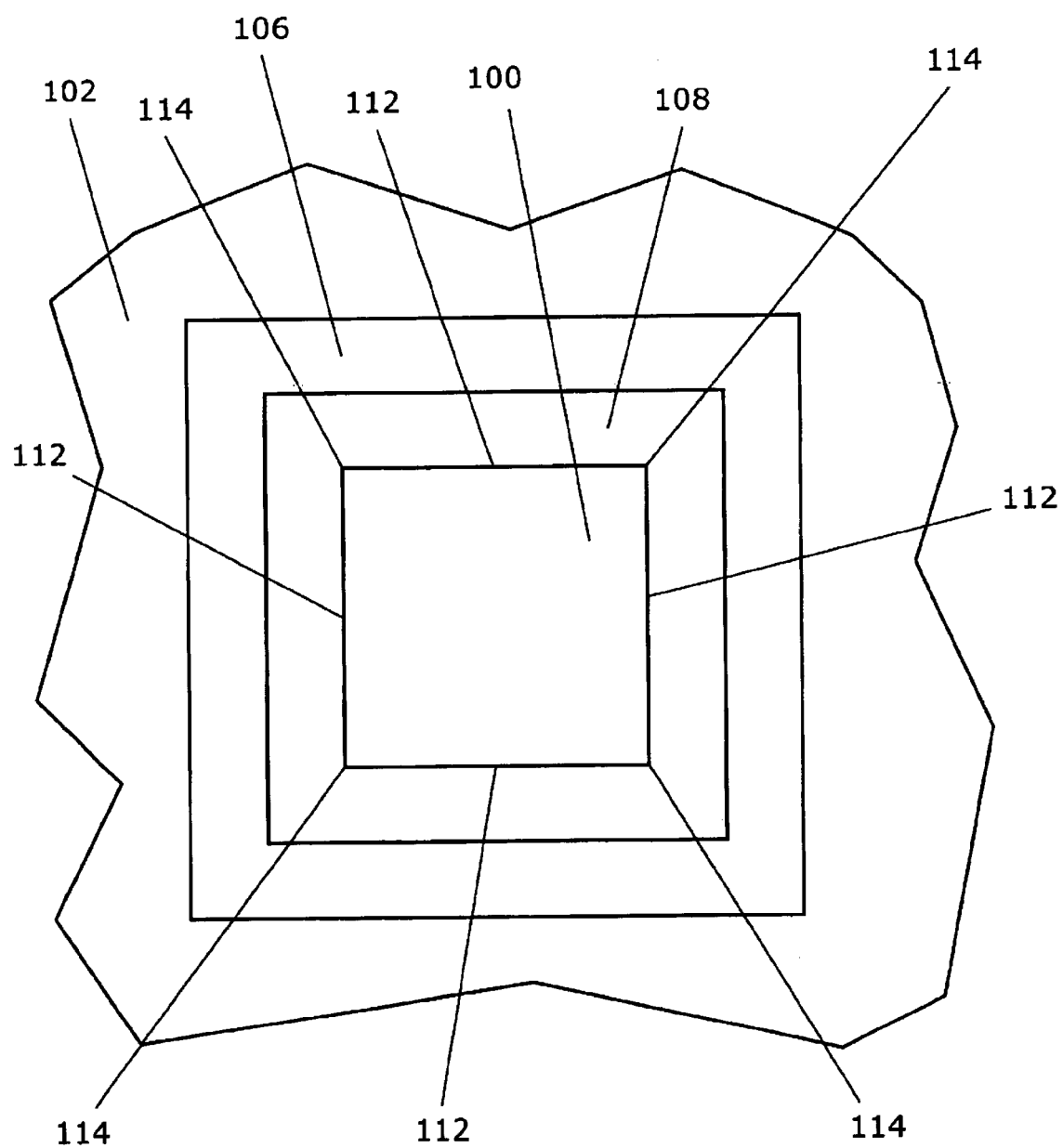
FIG. 3 is a top plane view of the flip chip of FIG. 2 having a stress shield abutting the edges of the flip chip, according to the present invention.
Figure 4A:
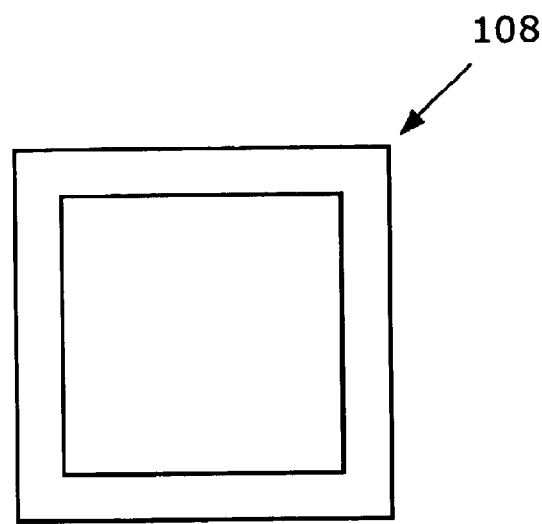
FIGS. 4a–4c are various embodiments of the stress shield, according to the present invention.
Figure 4B:
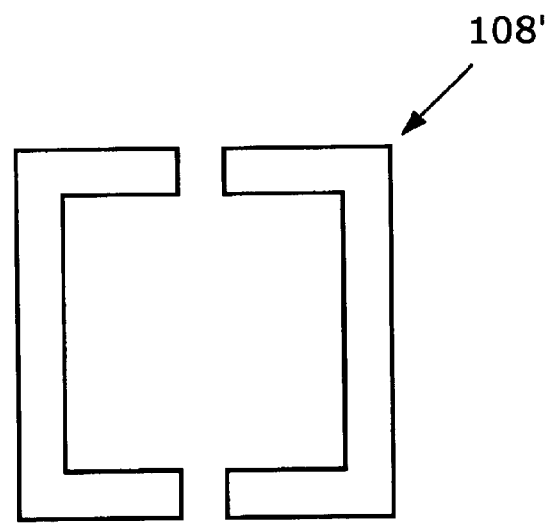
Figure 4C:
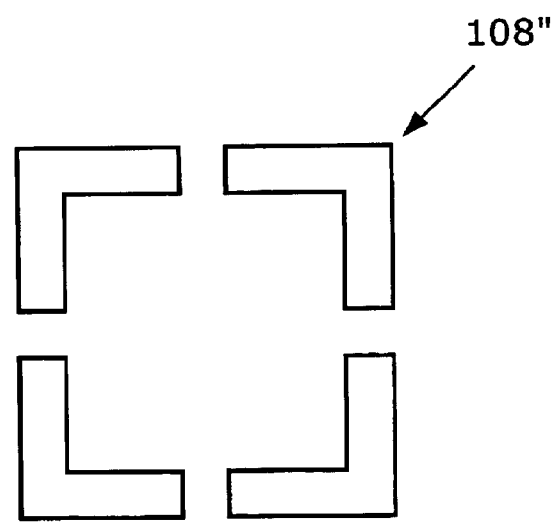

FIG. 3 shows a top view of FIG. 2, which shows the stress shield 108 completely surrounding the microelectronic die 100. Thus, both the sides 112 and corners 114 of the microelectronic die 100 are abutted by the stress shield 108. This type of stress shield 108 is also shown in FIG. 4a. However, the stress shield 108 may be a variety of configurations, including but not limited to a two-piece shield 108', as shown in FIG. 4b, and a four-piece shield 108", as shown in FIG. 4c.

FIGS. 5a and 5b show a method of applying a stress shield 108 in a flip chip attachment. As shown in FIG. 5a, after the microelectronic die 100 is attached to the carrier substrate 102 and the underfill material 106 disposed therebetween, the assembly is flipped such that that the microelectronic die 100 is below the carrier substrate 102. As shown in FIG. 5b, the stress shield 108 is placed on a portion of the underfill material 106 extending from the microelectronic die 100, which pulls the stress shield 108 into the underfill material 106 by capillary action. It is, of course, understood that the stress shield 108 can be placed in or on the portion of the underfill material 106 extending from the microelectronic die 100, such as by simply sitting the stress shield 108 thereon or by utilizing an externally applied mechanical force to the stress shield 108.

Figure 6A:
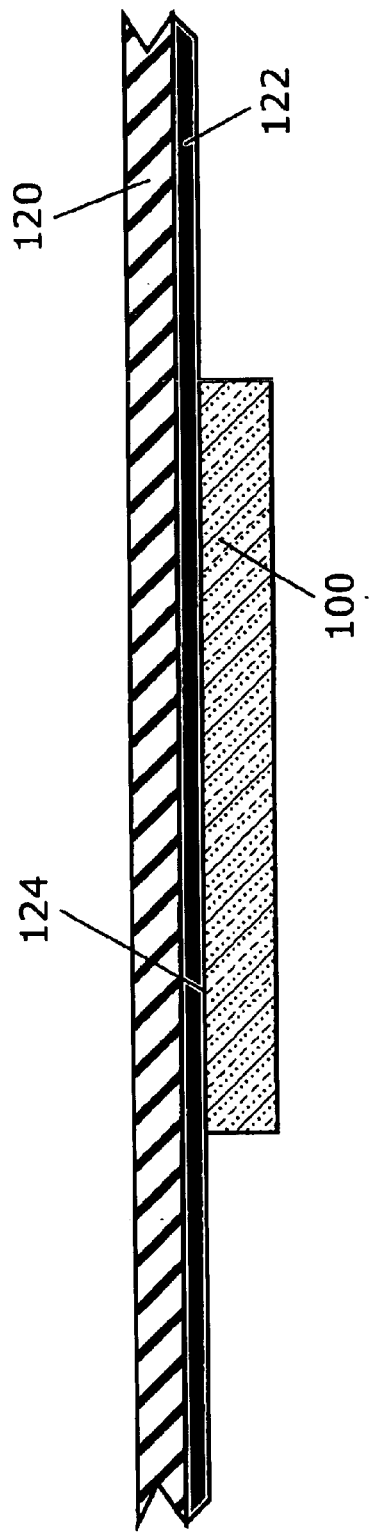
Figure 6B:
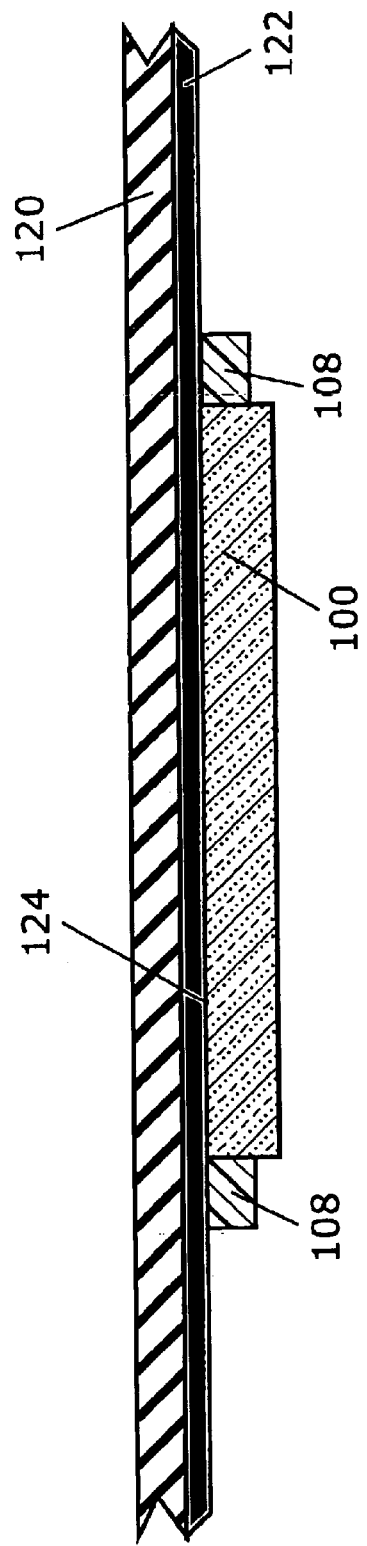

FIGS. 6a–6d illustrates the use of a stress shield 108 in a COF assembly. A flex component 120 (i.e., the carrier substrate) is attached with an adhesive layer 122 to an active surface 124 of microelectronic die 100, as shown in FIG. 6a. The stress shield 108 is placed against at least one side 112 of the microelectronic die 100 wherein it attaches to the adhesive layer 122, as shown in FIG. 6b. The microelectronic die 100 and the stress shield 108 is then encapsulated with an encapsulating material 126, such as plastics, resins, and the like, as shown in FIG. 6c, that covers the side(s) 112 of the microelectronic die 100, and abuts a bottom surface 128 of the adhesive layer 122 (the portion not covered by the microelectronic die 100 and the stress shield 108). Dielectric material and traces (shown generically as layer 130) are then fabricated on the flex component 120. Details of the formation of such layers are described for FIGS. 9a–9d.

FIGS. 7a–7e illustrates the use of a stress shield 108 in a build-up layer assembly. A protective film 140 is attached with a layer of adhesive (not shown) to the microelectronic die active surface 124, as shown in FIG. 7a. The stress shield 108 is placed against at least one microelectronic die side 112 wherein it attaches to the protective film 140, as shown in FIG. 7b. The microelectronic die 100 and the stress shield 108 is then encapsulated with the encapsulating material 126, such as plastics, resins, and the like, as shown in FIG. 7c, that covers the microelectronic die side(s) 112 of the microelectronic die 100, and abuts a bottom surface 142 of the film 140 (the portion not covered by the microelectronic die 100 and the stress shield 108). The protective film 140 is removed, as shown in FIG. 7d. This results in the encapsulating material 126 and the stress shield 108 substantially sharing a common plane with the microelectronic die active surface 124. Dielectric material and traces (shown generically as layer 144 and 146) are then fabricated over the microelectronic die active surface 124 and a first surface 148 of the encapsulating material 126. Details of the formation of such layers are described for FIGS. 9a–9d.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package, comprising:
   providing a microelectronic die having an active surface and at least one side; and
   placing a stress shield adjacent abutting said microelectronic die only at said at least one microelectronic die side.

2. The method of claim 1, wherein placing said stress shield comprising placing a stress shield fabricated from a material having a coefficient of thermal expansion substantially equivalent to a coefficient of thermal expansion of said microelectronic die adjacent said at least one microelectronic die side.

3. The method of claim 1, wherein placing said stress shield comprises placing a stress shield fabricated from a material selected from the group consisting of silicon, molybdenum, and aluminum nitride adjacent said at least one microelectronic die side.

4. The method of claim 1, wherein said placing said stress shield comprises placing said stress shield adjacent a corner of said microelectronic die.

5. A method of fabricating a microelectronic package, comprising:
providing a carrier substrate having a first surface;
attaching an active surface of a microelectronic die to said carrier substrate first surface with a plurality of solder balls; and
abutting a stress shield to at least one side of said microelectronic die.

6. The method of claim 5, wherein abutting said stress shield comprises abutting a stress shield fabricated from a material having a coefficient of thermal expansion substantially equivalent to a coefficient of thermal expansion of said microelectronic die to at least one side of said microelectronic die.

7. The method of claim 5, wherein abutting said stress shield comprises abutting a stress shield fabricated from a material selected from the group consisting of silicon, molybdenum, and aluminum nitride to at least one side of said microelectronic die.

8. The method of claim 5, wherein abutting said stress shield comprises abutting said stress shield adjacent a corner of said microelectronic die.

9. The method of claim 5, further including disposing an underfill material between said microelectronic die active surface and said carrier substrate first surface.

10. The method of claim 9, further including contacting said stress shield contacts with said underfill material.

11. A method of fabricating a microelectronic package, comprising:
providing a carrier substrate having a first surface;
disposing an adhesive layer on said carrier substrate first surface;
attaching an active surface of a microelectronic die to said adhesive layer; and
abutting a stress shield to at least one side of said microelectronic die.

12. The method of claim 11, wherein abutting said stress shield comprises abutting a stress shield fabricated from a material having a coefficient of thermal expansion substantially equivalent to a coefficient of thermal expansion of said microelectronic die to at least one side of said microelectronic die.

13. The method of claim 11, wherein abutting said stress shield comprises abutting a stress shield fabricated from a material selected from the group consisting of silicon, molybdenum, and aluminum nitride to said at least one side of said micronelectronic die.

14. The method of claim 11, wherein said abutting said stress shield comprises abutting said stress shield adjacent a corner of said microelectronic die.

15. The method of claim 11, further including contacting said stress shield with said adhesive layer.

16. The method of claim 11, further including abutting an encapsulation material to said stress shield and to a portion of said adhesive layer.

17. The method of claim 11, further including disposing at least one conductive trace on a second surface of said carrier substrate, wherein at least a portion of said at least one conductive trace extends through said carrier substrate and said adhesive layer and contacts said microelectronic die active surface.

18. A method of fabricating a microelectronic package, comprising:
providing a microelectronic die having an active surface and at least one side;
abutting a stress shield to said microelectronic die only at at least one side of said microelectronic die; and
disposing an encapsulating material to abut said stress shield, wherein a portion of said encapsulating material, a portion of said stress shield, and said microelectronic die active surface substantially share a common plane.

19. The method of claim 18, wherein abutting said stress shield comprises abutting a stress shield fabricated from a material having a coefficient of thermal expansion substantially equivalent to a coefficient of thermal expansion of said microelectronic die to said at least one side of said microelectronic die.

20. The method of claim 18, wherein abutting said stress shield comprises abutting a stress shield fabricated from a material selected from the group consisting of silicon, molybdenum, and aluminum nitride to said at least one side of said microelectronic die.

21. The method of claim 18, wherein abutting said stress shield comprises abutting said stress shield adjacent a corner of said microelectronic die.

22. The method of claim 18, further including disposing at least one dielectric layer on said encapsulating material, said stress shield, and said, microelectronic die active surface; and disposing a conductive trace on said dielectric layer, wherein at least a portion of said at least one conductive trace extends through said at least one dielectric layer and contacts said microelectronic die active surface.

* * * * *

UNITED STATES PATENT AND TRADEMARK OFFICE
CERTIFICATE OF CORRECTION

PATENT NO. : 6,764,876 B2
DATED : July 20, 2004
INVENTOR(S) : Ma

It is certified that error appears in the above-identified patent and that said Letters Patent is hereby corrected as shown below:

Column 4,
Line 54, delete "adjacent".

Column 6,
Line 43, delete "said," and insert -- said --.

Signed and Sealed this

Thirtieth Day of November, 2004

JON W. DUDAS
*Director of the United States Patent and Trademark Office*